Figure 2A:
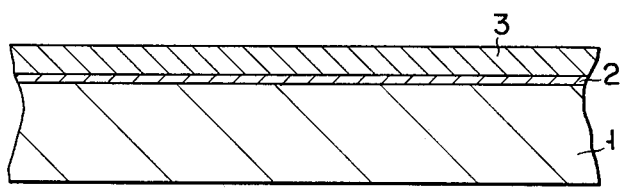

United States Patent [19]

Nozawa

[11] 4,441,941
[45] Apr. 10, 1984

[54] METHOD FOR MANUFACTURING A SEMICONDUCTOR DEVICE EMPLOYING ELEMENT ISOLATION USING INSULATING MATERIALS

[75] Inventor: Hiroshi Nozawa, Yokohama, Japan

[73] Assignee: Tokyo Shibaura Denki Kabushiki Kaisha, Japan

[21] Appl. No.: 240,300

[22] Filed: Mar. 4, 1981

[30] Foreign Application Priority Data

| Mar. 6, 1980 | [JP] | Japan | 55-27310 |
| Mar. 6, 1980 | [JP] | Japan | 55-27311 |
| Mar. 12, 1980 | [JP] | Japan | 55-30307 |
| Jul. 10, 1980 | [JP] | Japan | 55-93254 |

[51] Int. Cl.³ .......................................... H01L 21/22
[52] U.S. Cl. ................................... 148/187; 148/188;
29/571; 29/576 B; 29/576 W; 29/578
[58] Field of Search ................ 29/571, 576 B, 576 W, 29/578; 148/187, 188

[56] References Cited

U.S. PATENT DOCUMENTS

| 3,752,711 | 8/1973 | Kooi et al. | 148/33.3 |
| 3,943,542 | 3/1976 | Ho et al. | 357/23 |
| 3,970,486 | 7/1976 | Kooi | 148/187 |
| 4,037,309 | 7/1977 | Smith | 29/571 |
| 4,054,989 | 10/1977 | Ho et al. | 29/571 |
| 4,080,718 | 3/1978 | Richman | 29/571 |
| 4,127,931 | 12/1978 | Shiba | 29/571 |
| 4,180,596 | 12/1979 | Crowder et al. | 29/571 X |
| 4,282,647 | 8/1981 | Richman | 148/187 X |
| 4,292,091 | 9/1981 | Togei | 148/187 X |

FOREIGN PATENT DOCUMENTS 49-23071 6/1974 Japan.
50-7425 3/1975 Japan.

OTHER PUBLICATIONS

"Local Oxidation of Silicon and Its Application in Semiconductor-Device Technology," J. A. Appels et al., *Philips Res. Repts.* 25, pp. 118–132, 1970.

*Primary Examiner*—G. Ozaki
*Attorney, Agent, or Firm*—Finnegan, Henderson, Farabow, Garrett & Dunner

[57] ABSTRACT

A method for element isolation utilizing insulating materials on a semiconductor substrate in which an oxidizable material layer of polycrystalline silicon or the like is formed overlying the substrate surface, the oxidizable material layer disposed at the element-isolation-forming regions is oxidized using an oxidation mask, the oxidation mask is removed and, if necesary at least part of the unoxidized oxidizable material below the mask is removed. Predetermined processes such as oxidation and diffusion are performed thereafter to form semiconductor elements such as MOS transistors and bipolar transistors with high packaging density and reliability.

10 Claims, 28 Drawing Figures

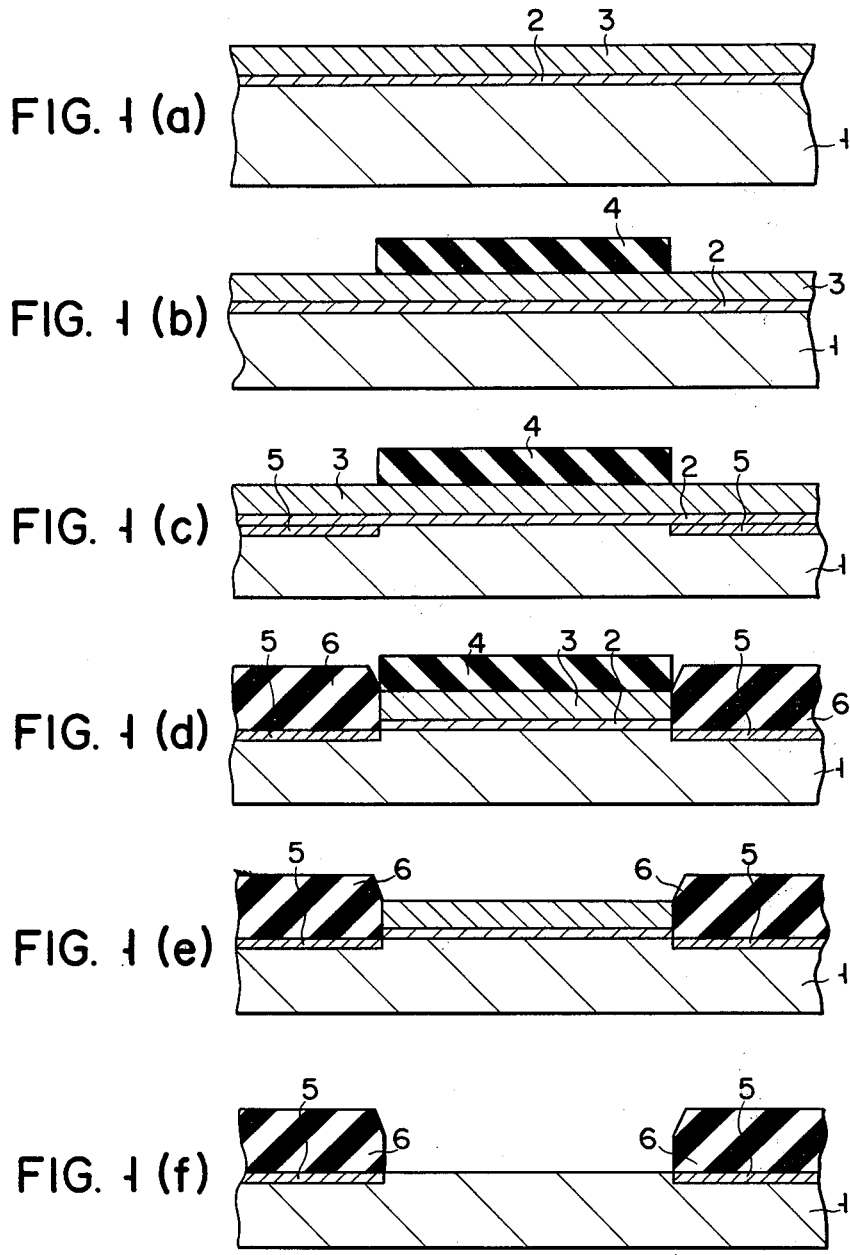

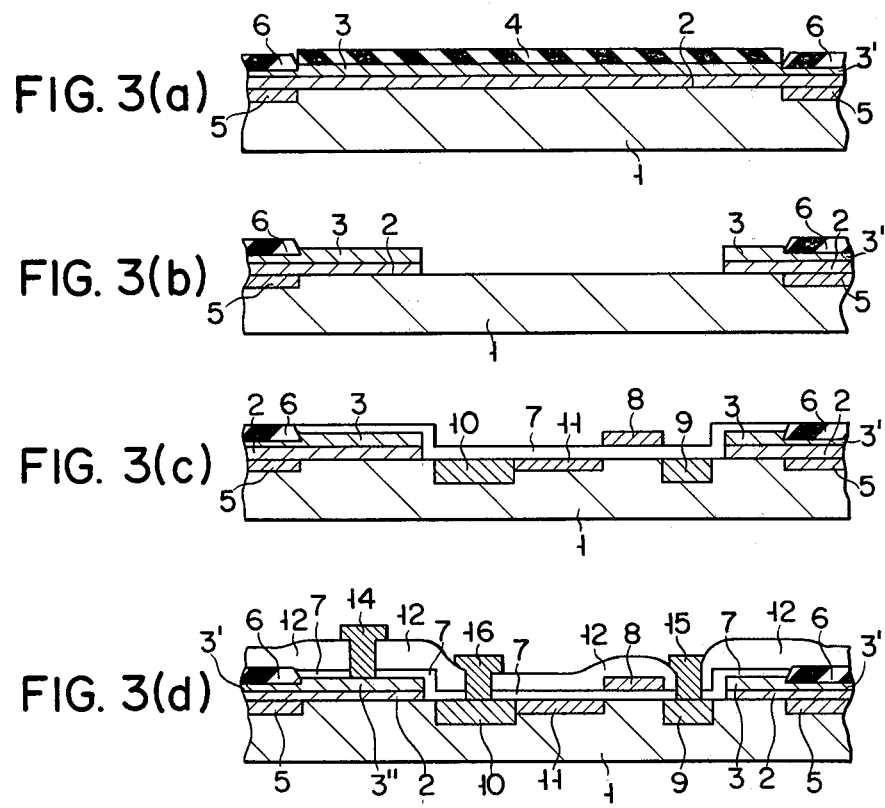
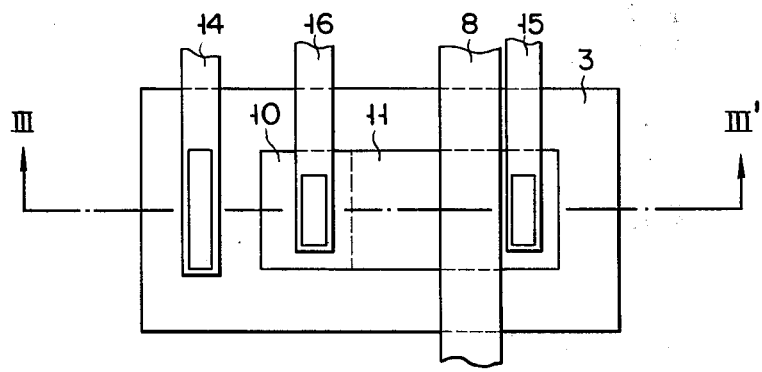

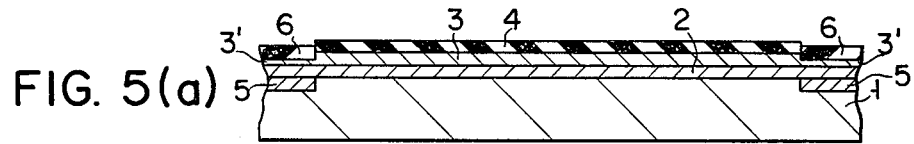
FIG. 5(a)
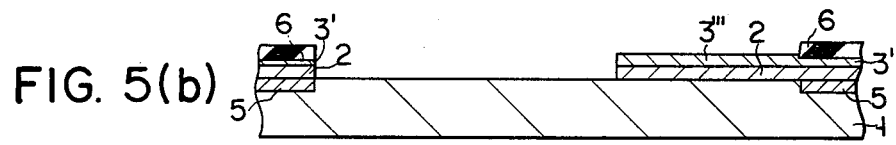
FIG. 5(b)
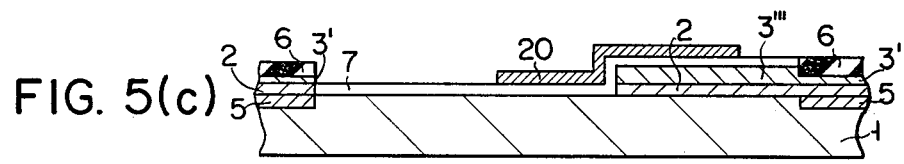
FIG. 5(c)
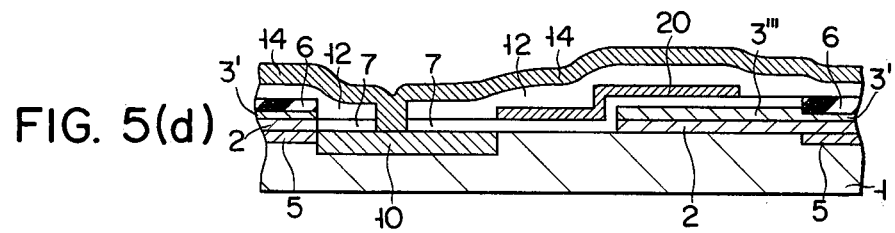
FIG. 5(d)
FIG. 6
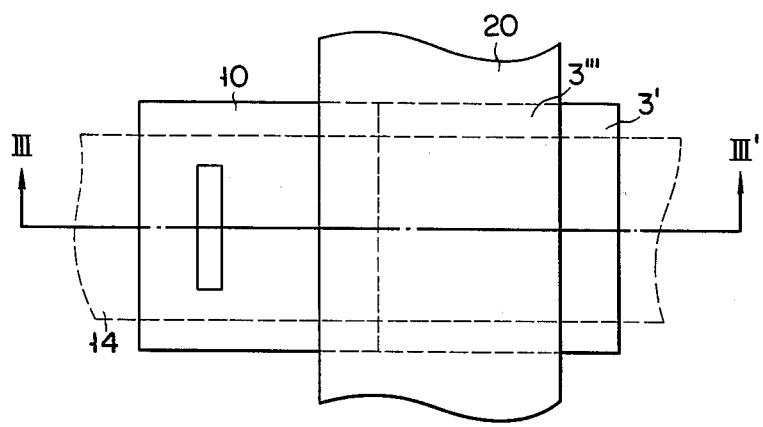

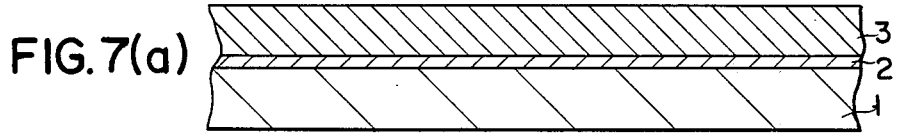
FIG.7(a)
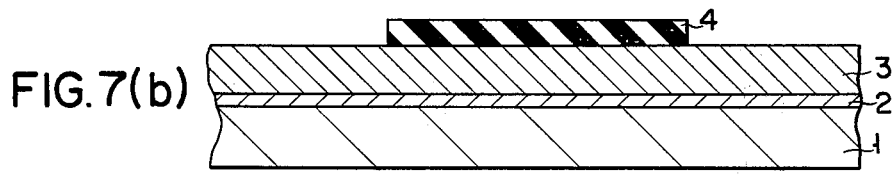
FIG.7(b)
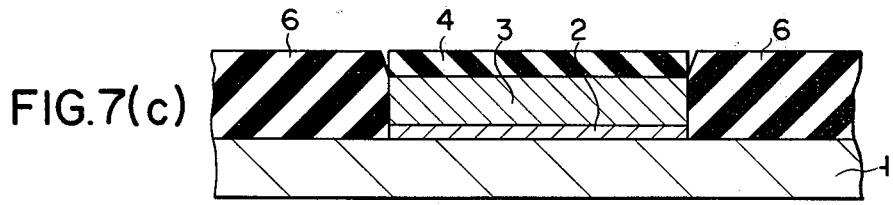
FIG.7(c)
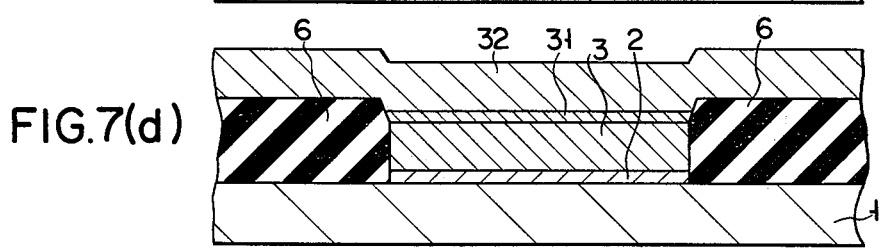
FIG.7(d)
FIG. 8
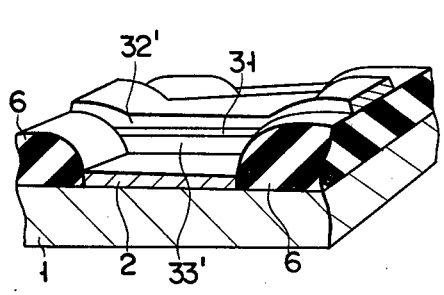
FIG. 9
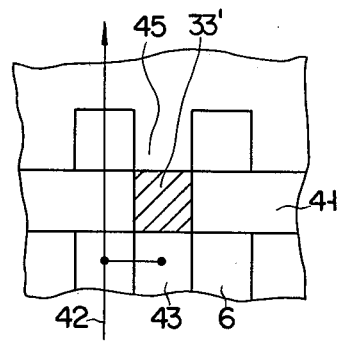

METHOD FOR MANUFACTURING A SEMICONDUCTOR DEVICE EMPLOYING ELEMENT ISOLATION USING INSULATING MATERIALS

The present invention relates to a method for manufacturing a semiconductor device and, more particularly, to an element isolation method using insulating materials. The present invention further relates to a semiconductor device manufactured by such a method.

As isolation techniques in semiconductor integrated circuits, there are generally known methods in which isolation regions are formed by selective oxidation for facilitating higher packaging density and a more effective manufacturing process. According to such methods, since the periphery of the active region is surrounded by an oxide layer, self-alignment is possible using methods such as base diffusion so that unnecessary parts which have been conventionally required for masking may be eliminated. This allows higher packaging density. Furthermore, since the sides of the actual regions comprise deep oxide layers, the coupling capacitance is significantly reduced. However, in this method the thermally oxidized layer is selectively embedded in the silicon substrate, degrades the electrical characteristics of the element, and thus imposes strict limits as to selection of the structure, configuration, film thickness, the conditions for selective oxidation of the oxidation mask, and occasionally on the selection of the material itself for the silicon substrate. This is disclosed, for example, in IEDM, "High Pressure Oxidation for Isolation of High Speed Bipolar Devices", pp. 340 to 343, 1979.

In the conventional element isolation technique utilizing insulating material, the field oxidizing time is long. This contributes significantly to the diffusion and redistribution of the impurity layer in the channel stopper. For example, when the diffusion in the transverse direction is great, the effective channel width of MOS transistors is reduced and the drain coupling capacitance increases, thus obstructing realization of a high speed device. The implanted ion dose must be increased or the accelerating voltage must be made greater to compensate for the redistribution of the impurity in the oxide layer. This leads to degradation of the yield through damage caused by the ion implantation. When annealing is performed using the nitride layer as a mask, a silicon nitride layer called a "white ribbon" is formed in the silicon substrate below the nitride layer, leading to defective voltage resistance of the element.

It is, therefore, the primary object of the present invention to provide a method for manufacturing a semiconductor device employing element isolation utilizing insulating materials, which is advantageous for higher packaging density, which prevents degradation of the electrical characteristics by thermal stress in the semiconductor substrate, which also prevents disconnections of the wiring, and which provides excellent reliability and yield. Another object of the present invention is to provide a semiconductor device manufactured by such a method.

According to one aspect of the present invention, there is provided a method for manufacturing a semiconductor device employing element isolation by forming insulating materials in a semiconductor substrate, said method comprising the steps of:

forming an oxidizable material layer on the semiconductor substrate;

partially forming an oxidation mask on said oxidizable material layer;

oxidizing at least part of said oxidizable material layer not covered with said oxidation mask for forming an oxide layer; and removing said oxidation mask.

According to another aspect of the present invention, there is also provided a semiconductor device having a conductive layer including a shield layer formed over part of the surface of a substrate with a first insulation layer interposed therebetween, a second insulation layer formed on said conductive layer, and an active region formed in said semiconductor substrate at a place other than immediately below said shield layer, characterized in that, said conductive layer comprises a thick oxidizable conductive layer and a thin oxidizable conductive layer which corresponds in position to said shield layer; and said second insulation layer comprises a thin second insulation layer formed on said thick oxidizable conductive layer and a thick second insulation layer formed on said thin oxidizable conductive layer by oxidation of said oxidizable conductive layers.

According to still another aspect of the present invention, there is also provided a semiconductor device having a semiconductor substrate of first conductivity type, a source region and a drain region of second conductivity type formed in said semiconductor substrate, a conductive layer formed on said semiconductor substrate with an insulation layer interposed therebetween, and a field insulation layer formed on said semiconductor substrate at a place other than at an element-forming region of said semiconductor substrate, characterized in that said field insulation layer is formed by partial oxidation of said conductive layer, and the unoxidized part of said conductive layer terminates at the edge of said field insulation layer.

This invention can be more fully understood from the following detailed description when taken in conjunction with the accompanying drawings, in which:

FIGS. 1(a) to 1(f) are a sequence of sectional views illustrating one embodiment of a method performed according to the present invention;

FIGS. 2(a) to 2(f) are a sequence of sectional views illustrating another embodiment of a method performed according to the present invention;

FIGS. 3(a) to 3(d) are a sequence of sectional views illustrating an embodiment of a method for manufacturing a high voltage resistant MOS transistor according to the present invention;

FIG. 4 is a plan view of FIG. 3(d);

FIGS. 5(a) to 5(d) are a sequence sectional views illustrating an embodiment of the method of the present invention as applied to the manufacture of a dynamic type MOS RAM;

FIG. 6 is a plan view of FIG. 5(d);

FIGS. 7(a) to 7(d) are a sequence of sectional views illustrating an embodiment of the method of the present invention as applied to the manufacture of an EPROM;

FIG. 8 is a partial, schematic perspective view of an EPROM element manufactured according to the method of the present invention; and FIG. 9 is a partial, schematic plan view of the EPROM element shown in FIG. 8.

The term oxidizable material, in the present specification means materials such as non-monocrystalline silicon or the like which may be oxidized at a relatively fast speed, for example, at a speed faster than that required for oxidizing the semiconductor substrate used. The oxidizable material may contain an impurity at a high concentration or may not contain any substantial impurity. The term active region, in this specification is taken to mean regions containing active elements such as FET type transistors or the like, as well as semiconductor element-forming regions for passive element such as resistors and capacitive elements.

The present invention will now be described in more detail with reference to examples.

FIGS. 1(a) to 1(d) are schematic sectional views for explaining in detail the present invention. As shown in FIG. 1(a), an insulation layer such as an oxide layer 2 of 1,000 Å thickness is formed on a semiconductor substrate such as an n-type monocrystalline silicon substrate 1. Although an n-type monocrystalline silicon substrate is used in the description of the present invention, it is to be understood that a p-type monocrystalline silicon substrate or a compound semiconductor may also be used. Although the formation of the oxide layer 2 is preferable to avoid adverse effects which might otherwise result, it is not necessary. A polycrystalline silicon layer 3 of 0.4 μm thickness containing phosphorus to a high concentration (e.g., $1 \times 10^{20}/cm^3$) is formed on the oxide layer 2 by chemical vapor deposition in a PH$_3$ atmosphere as a material layer. Instead of polycrystalline silicon, molybdenum silicide or tungsten silicide may be used. Instead of phosphorus, the high concentration impurity may be boron, arsenic or the like. Furthermore, it is possible to add the impurity and the silicon source while simultaneously forming the polycrystalline silicon layer 3.

Then, as shown in FIG. 1(b), a silicon nitride layer as an oxidation mask is formed to a thickness of 1,000 to 3,000 Å by chemical vapor deposition. The part of the silicon nitride layer to become the channel stopper region is removed by photoetching to provide an oxidation mask 4. As shown in FIG. 1(c), ion implantation is performed using this silicon nitride layer 4 as a mask to form impurity layers in and of the same conductivity type as the substrate to provide channel stoppers 5. In this case, the photoresist mask used for forming the oxidation mask may also be used as the impurity doping mask. The doping of the impurity in the polycrystalline silicon layer 3 as shown in FIG. 1(a) may be performed simultaneously with the formation of the channel stoppers using the silicon nitride layer 4 as a mask, or it may be performed in a separate process by ion implantation. Depending upon the purpose, the formation of the channel stoppers 5 may be eliminated if not necessary. Then, as shown in FIG. 1(d), the polycrystalline silicon layer 3 is selectively oxidized to form thick oxide layers 6 of about 8,000 Å thickness for isolating the elements. As shown in FIG. 1(e), the silicon nitride layer 4 used as the oxidation mask is removed by dry etching. Thereafter, the polycrystalline silicon layer 3 and the oxide layer 2 are selectively etched. After predetermined processing, the structure may be used for the manufacture of a ROM (read-only-memory).

Alternatively, as shown in FIG. 1(f), the silicon nitride layer 4 and the unoxidized portion of the polycrystalline silicon layer 3 are removed by dry etching. The oxide layer 2 which was interposed between the polycrystalline silicon layer 3 and the semiconductor substrate 1 is removed by an ammonium fluoride solution to expose part of the surface of the semiconductor substrate. Thereafter, a series of processes including oxidation, diffusion and so on are performed to form in the exposed portion of semiconductor substrate 1 elements such as MOS transistors, bipolar transistors and so on.

In the above embodiment, the polycrystalline silicon layer 3 was selectively oxidized on the surface of the semiconductor substrate 1. Another embodiment will now be described wherein the polycrystalline silicon layer is interposed between an thick oxide layer and the oxide layer formed on the substrate in order to be used as a shield layer.

First, as shown in FIG. 2(a), the oxide layer 2 of about 1,000 Å thickness and the polycrystalline silicon layer 3 of about 0.6 μm thickness and containing phosphorus to a high concentration are formed by the same process as in FIG. 1(a). As compared with the above embodiment, the polycrystalline silicon layer 3 is formed thicker to leave a shield layer.

Figure 2B:
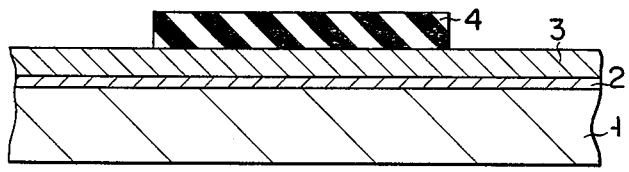

Next, as shown in FIG. 2(b), the silicon nitride layer 4 as the oxidation mask is formed by the same process as in FIG. 1(b).

Figure 2C:
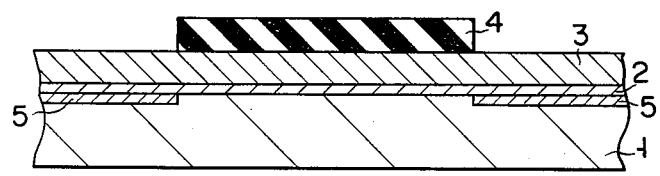
Figure 2D:
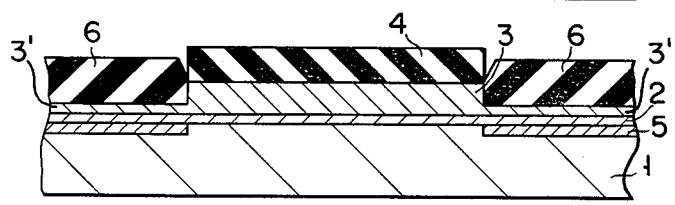

If necessary, as shown in FIG. 2(c), ion implantation is performed using the silicon nitride layer 4 as a mask to form the impurity regions 5 of the same conductivity type as the substrate 1 to provide the channel stoppers 5. As shown in FIG. 2(d), the polycrystalline silicon layer 3 is selectively oxidized using the silicon nitride layer 4 as a mask. By oxidizing the polycrystalline silicon layer, thick oxide layers 6 of about 8,000 Å thickness for isolation of elements are embedded in the polycrystalline silicon layer 3. The polycrystalline silicon layers 3 of about 0.2 μm thickness are left unoxidized below the thick oxide layers 6.

Figure 2E:
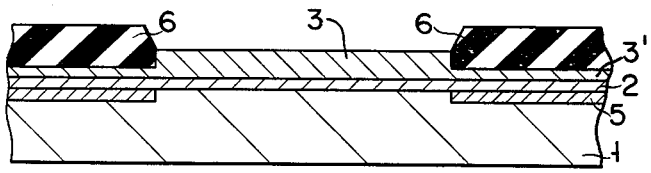

Then, as shown in FIG. 2(e), the silicon nitride layer 4 used as the oxidation mask is removed by plasma etching. Thereafter, the polycrystalline silicon layer 3 and the annealed layer 2 are selectively etched. After predetermined processing, this structure may be used for the manufacture of high voltage resistant MOS transistors or the like.

Figure 2F:
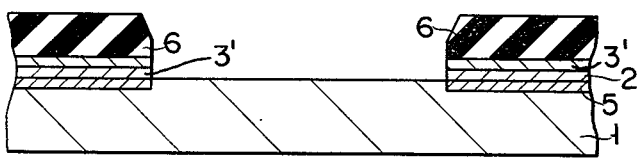

Alternatively, as shown in FIG. 2(f), the silicon nitride layer 4 used as the oxidation mask and the polycrystalline silicon layer 3 not covered with the thick oxide layers are removed by dry etching. The oxide layer 2 which was interposed between the polycrystalline silicon layer 3 and the semiconductor substrate 1 is removed with an ammonium fluoride solution to partially expose the surface of the substrate.

Thereafter, a series of processes such as oxidation, diffusion, and so on are performed on the surface of the substrate 1. The polycrystalline silicone layer 3 below the thick oxide layers 6 are wired to be used as a shield layer to form semiconductor elements such as MOS transistors, bipolar transistors and so on.

Accordingly, since the oxidizable material such as polycrystalline silicon is selectively oxidized to form thick oxide layers, defects due to stress may be caused in the oxidizable material but not in the substrate. For this reason, a semiconductor element having excellent characteristics may be manufactured, providing a method for manufacturing a semiconductor device with high reliability and yield.

Since a layer containing only silicon nitride may be used as the oxidation mask 5, the length of the bird's beak becomes short, which is advantageous for achieving higher packaging density. When the photoresist is used as the impurity doping mask, the element forming regions and the channel stoppers 5 are isolated by forming the silicon nitride layer 4 to have a smaller area to a high concentration, the oxidizing speed of the oxidizable material is increased, resulting in economy. This also shortens the time for heat treatment of the elements, so that performance is improved and adverse effects from thermal stress may be prevented. The same effects may be obtained however, even if the impurity is not diffused.

The field region, that is, the non-monocrystalline silicon layer, such as the polycrystalline silicon layer 10 below the thick oxide layers 6, has a small specific resistance. Thus, it functions as part of the internal wiring by capacitance division of the potential, even when the wiring is not connected, so that high voltage resistance may be provided, resistance to outside contamination such as Na ions may be strengthened, and higher reliability may be obtained. In addition to this, since the field oxidation time is short, the transverse diffusion of the channel stoppers becomes small so that the effective channel width in the MOS transistor becomes great, the drain coupling capacitance becomes small, and high speed operation is realized. Since the semiconductor substrate is not oxidized, diffusion of the impurity into the oxide layer by redistribution may be decreased. The dose of the ion impurity may be made smaller for this reason, providing a method for manufacturing a semiconductor device according to which the damage due to ion implantation may be smaller and the yield may be greater.

Although the silicon nitride layer 4 was used as the oxidation mask in the above embodiment, one or more layers of known oxidation mask such as alumina may alternatively be formed.

A description follows in which the method of the present invention is applied to the production of a high voltage resistant MOS transistor integrated circuit, referring to FIGS. 3(a) to 3(d). According to the same procedure as in FIGS. 2(a) to 2(d), as shown in FIG. 3(a), ion implantation is performed using the silicon nitride layer 4 as a mask to form the channel stoppers 5, which are high impurity concentration layers of the same conductivity type as the substrate 1, while simultaneously doping the impurity into the polycrystalline silicon layer 3. Thereafter, the thick oxide layers 6 of about 8,000 Å thickness are formed for isolation of the elements, leaving therebeneath an unoxidized polycrystalline silicon layer 3' of about 0.2 μm thickness.

Then, as shown in FIG. 3(b), the silicon nitride layer 4 used as the oxidation mask is removed by dry etching, and a portion of polycrystalline silicon layer 3 not covered with the exposed thick oxide layers 6 is selectively removed by dry etching. The oxide layer 2 which was interposed between the polycrystalline, silicon layer 3 and the semiconductor substrate 1 is removed with an ammonium fluoride solution to partially expose the surface of the semiconductor substrate. Thereafter, as shown in FIG. 3(c), a gate oxide layer 7 is formed by annealing in oxygen to a thickness of 1,000 Å. The exposed part of the polycrystalline silicon layer 3 is simultaneously covered with the oxide layer 7. A polycrystalline silicon layer is then formed by chemical vapor deposition and doped with an impurity for forming a gate electrode 8 by photolithography. This gate electrode 8 is insulated from the polycrystalline layer by the oxide layer 7. Diffusion of an impurity of opposite conductivity type to that of the substrate 1 is performed such that the drain side has an offset gate structure to form a source 9 and a drain 10. Ion implanation is performed in offset gate part 11 to form a region of a lower impurity concentration than the drain 10. Finally, as shown in FIG. 3(d), insulation silicon oxide layers 12 are formed by chemical vapor deposition. Electrode-connecting holes to a protective gate 3'', the gate 8, the source 9, and the drain 10 are formed by photolithography. Internal wirings 14, 15 and 16 are arranged by the patterning of metal layers such as aluminum to complete the structure.

FIG. 4 is a schematic plan view of the device of FIG. 3(d). FIG. 3(d) corresponds to a schematic sectional view taken along the line III—III' of FIG. 4.

Referring to FIGS. 5(a) to 5(d), a description follows in which the method of the present invention is applied to the production of a dynamic type MOS RAM. FIG. 5(a) corresponds to the device produced by the steps illustrated in FIGS. 2(a) to 2(d). As shown in FIG. 5(b), the silicon nitride layer 4 used as the oxidation mask is removed by dry etching, and the polycrystalline silicon layer 3 not covered by the exposed thick oxide layers 6 is selectively removed by dry etching. This process is performed so that the remaining polycrystalline silicon layer not covered by the thick oxide layers can be used as an electrode 3''' of a capacitor for storing charge. This one electrode 3''' of the capacitor is formed along the border between the thick oxide layers 6 and the active regions. The oxide layer 2 exposed by the selective etching of the polycrystalline silicon layer 3 is removed by an ammonium fluoride solution to partially expose the surface of the semiconductor substrate 1. Thereafter, as shown in FIG. 5(c), the gate oxide layer 7 is formed by oxidizing to a thickness of about 1,000 Å. The exposed part of the polycrystalline silicon layer 3 (one electrode 3''') is covered with the gate oxide layer 7. Thereafter, a polycrystalline silicon layer is formed by the chemical vapor deposition and doped with an impurity to form a gate electrode 20 for word line selection by photolithography. The electrode 3''' of the capacitor for storing charge and the gate electrode 20 are insulated from each other by the oxide layer 7. The potential of the electrode 3''' of the capacitor for storing charge is supplied by the polycrystalline silicon layer 3' below the thick oxide layers 6. Finally, as shown in FIG. 5(d), an impurity of different conductivity type from that of the semiconductor substrate 1 is doped to form the drain 10 using as a mask the polycrystalline silicon of 3', 3''', and 20 and the thick oxide layers 6. Thereafter, the insulation silicon oxide layers 12 are grown by chemical vapor deposition. The electrode-connecting holes to the drain 10, the gate electrode 20, and the electrode 3''' of the capacitor are formed by photolithography. The internal wiring 14 is arranged by the patterning of metal layers such as aluminum to complete the structure.

FIG. 6 is a schematic plan view of the device of FIG. 5(d). FIG. 5(d) is a schematic sectional view taken along the line III-III' of FIG. 6.

Since the polycrystalline silicon layer 3 is formed with thick parts and thin parts in this construction, the oxide layers on the thick parts 3 may be made thinner than in the conventional case, facilitating the formation of the electrodes such as that for protective gate layer. On the thin parts 3 of the polycrystalline silicon layer, the oxide layers 3 formed thereon become thicker. When the channel stoppers 5 are formed thereunder, formation of an inverted layer at the surface of the substrate 1 below the oxide layers 2 may be more effectively prevented. Since the thick and thin parts of the polycrystalline layer 3 are effectively combined, a semiconductor device may be provided according to which the surface of the semiconductor substrate becomes smooth, disconnections of the wirings are reduced, the yield and reliability are improved, and the packaging density is increased.

Referring to FIGS. 7(a) to 7(d), a description follows in which the method of the present inventon is applied to the manufacture of an EPROM (Electrically Programmable Read Only Memory).

As shown in FIG. 7(a), an insulation layer such as the oxide layer 2 of about 1,000 Å thickness is formed on the surface of a semiconductor substrate such as the n-type monocrystalline silicon substrate 1. Thereafter, a conductive material layer which oxidizes fast such as the polycrystalline silicon layer 3 of about 0.4 μm thickness is formed by chemical vapor deposition in a PH₃ atmosphere on the oxide layer 2 to form a first monocrystalline silicon layer containing phosphorus in a high concentration. Then, as shown in FIG. 3(b), a silicon nitride layer is formed by chemical vapor deposition to a thickness of 1,000 to 3,000 Å and selectively removed by photoetching to provide the oxidation mask 4. As shown in FIG. 7(c), the polycrystalline silicon layer 3 is selectively oxidized using this silicon nitride layer 4 as a mask. By oxidizing the polycrystalline silicon layer 3, the field oxide layers 6 of about 8,000 Å thickness are formed for isolation of elements.

The silicon nitride layer 4 used as the acid-resistant mask is removed. To produce a second polycrystalline silicon layer for use as the gate of peripheral circuits, it is possible to remove the portions of first polycrystalline silicon layer 3 and the oxide layer 2, which surround field oxide layers 6. A polycrystalline silicon oxide layer 31 is then formed by oxidation, and a second polycrystalline silicon layer 32 is formed thereupon. Using a photoresist, the second polycrystalline silicon layer 32 is selectively etched to form a control gate 32' as shown in FIG. 8. Using the same photoresist, a floating gate 33' is formed from polycrystalline silicon layer 3 by the self-alignment etching technique of the polycrystalline silicon oxide layer 31 and the first polycrystalline silicon layer 3. FIG. 8 is a partial, schematic perspective view of FIG. 7(d) and illustrates the selective etching of the second polycrystalline silicon layer 32 and the first polycrystalline silicon layer 3. After processes such as oxidation, diffusion, chemical vapor deposition, and vapor evaporation required for formation of the appropriate elements, an EPROM is completed.

FIG. 9 is a schematic plan view illustrating part of an element of this EPROM wherein electrons are implanted into the floating gate 33' (hatched part) for programming by selecting a drain region 43 through a word line 41 and a data line 42. A source region 45 is grounded. The parts between the elements are insulated by the field oxide layers 6. As may be apparent from FIG. 9, in the EPROM produced according to the method of the present invention, due to the smooth floating gate terminal, the area of the floating gate is significantly reduced, the packaging density is greatly increased, and the storage of charge and reliability are improved.

The present invention is not limited to EPROMs, but may be applied to FAMOS type semiconductors which do not have control gates.

What is claimed is:

1. A method for manufacturing a semiconductor device employing element isolation of an active region in a semiconductor substrate by forming insulating materials, said method comprising the steps of:
   a. forming an oxidizable material layer on a surface of the semiconductor substrate;
   b. forming an oxidation mask on a portion of said oxidizable material layer overlying said active region;
   c. oxidizing at least part of said oxidizable material layer not covered with said oxidation mask forming an oxide layer for element isolation;
   d. removing said oxidation mask;
   e. partially exposing the surface of said semiconductor substrate by removing at least a part of said oxidizable material layer exposed by said step of removing said oxidation mask; and
   f. forming a semiconductor element in said exposed surface of said semiconductor substrate.

2. A method according to claim 1, wherein an oxide layer is interposed between said semiconductor substrate and said oxidizable material.

3. A method according to claim 1, wherein said oxidation mask is made of silicon nitride.

4. A method according to claim 1, wherein a step of doping an impurity into an oxide layer-forming region of said semiconductor substrate is performed before the step of oxidizing at least part of said oxidizable material layer.

5. A method according to claim 2, wherein a photoresist for forming said oxidation mask is used as the doping mask in the step of doping the impurity.

6. A method according to claim 5, wherein the area of said oxidation mask is smaller than that of said photoresist.

7. A method according to claim 1, wherein the step of oxidizing at least part of said oxidizable material layer results in forming an oxide layer as an upper layer and forming an unoxidized shield layer as a lower layer.

8. A method according to any one of claims 1–3 and 5–7, wherein said oxidizable material is non-monocrystalline silicon.

9. A method according to any one of claims 1–4 and 5–7, wherein said oxidizable material is a material which oxidizes faster than said semiconductor substrate.

10. A method according to claim 9, wherein said material which oxidizes faster than said semiconductor substrate is at least one member selected from the group consisting of polycrystalline silicon of high impurity concentration, molybdenum silicide, and tungsten silicide.

* * * * *